(12) United States Patent
Chuang et al.

(10) Patent No.: US 11,688,736 B2
(45) Date of Patent: *Jun. 27, 2023

(54) MULTI-GATE DEVICE AND RELATED METHODS

(71) Applicant: Taiwan Semiconductor Manufacturing Co., Ltd., Hsinchu (TW)

(72) Inventors: Li-Yang Chuang, Hsinchu (TW); Jia-Chuan You, Taoyuan County (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/657,941

(22) Filed: Apr. 4, 2022

(65) Prior Publication Data

US 2022/0231016 A1   Jul. 21, 2022

Related U.S. Application Data

(63) Continuation of application No. 16/947,377, filed on Jul. 30, 2020, now Pat. No. 11,296,082.

(51) Int. Cl.
*H01L 27/088* (2006.01)
*H01L 21/762* (2006.01)
(Continued)

(52) U.S. Cl.
CPC .... *H01L 27/0886* (2013.01); *H01L 21/76224* (2013.01); *H01L 21/823412* (2013.01);
(Continued)

(58) Field of Classification Search
CPC ......... H01L 21/02603; H01L 21/28141; H01L 21/76224; H01L 21/823412;
(Continued)

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |

(Continued)

*Primary Examiner* — David C Spalla
(74) *Attorney, Agent, or Firm* — Haynes and Boone, LLP

(57) ABSTRACT

A method of fabricating a semiconductor device includes providing a dummy structure having a plurality of channel layers, an inner spacer disposed between adjacent channels of the plurality of channel layers and at a lateral end of the channel layers, and a gate structure including a gate dielectric layer and a metal layer interposing the plurality of channel layers. The dummy structure is disposed at an active edge adjacent to an active region. A metal gate etching process is performed to remove the metal layer from the gate structure while the gate dielectric layer remains disposed at a channel layer-inner spacer interface. After performing the metal gate etching process, a dry etching process is performed to form a cut region along the active edge. The gate dielectric layer disposed at the channel layer-inner spacer interface prevents the dry etching process from damaging a source/drain feature within the adjacent active region.

20 Claims, 11 Drawing Sheets

(51) Int. Cl.
*H01L 21/8234* (2006.01)
*H01L 29/06* (2006.01)
*H01L 29/66* (2006.01)
*H01L 29/78* (2006.01)

(52) U.S. Cl.
CPC .. *H01L 21/823431* (2013.01); *H01L 29/0665* (2013.01); *H01L 29/6681* (2013.01); *H01L 29/7851* (2013.01); *H01L 29/7855* (2013.01)

(58) Field of Classification Search
CPC ..... H01L 21/823431; H01L 21/823807; H01L 21/823821; H01L 21/845; H01L 27/0886; H01L 27/0924; H01L 27/10879; H01L 27/1211; H01L 29/0642; H01L 29/0649; H01L 29/0653; H01L 29/0665; H01L 29/0669; H01L 29/0673; H01L 29/41791; H01L 29/66439; H01L 29/6653; H01L 29/66553; H01L 29/6656; H01L 29/6681; H01L 29/795; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 11,296,082 B2 * | 4/2022 | Chuang | H01L 29/0665 |
| 2013/0285116 A1 | 10/2013 | Lochtefeld et al. | |
| 2019/0221483 A1 * | 7/2019 | Mulfinger | B82Y 10/00 |
| 2020/0006559 A1 * | 1/2020 | Mehandru | H01L 29/66439 |
| 2020/0381426 A1 * | 12/2020 | Xu | H01L 29/0673 |
| 2021/0036121 A1 * | 2/2021 | Lim | H01L 29/78696 |
| 2021/0098627 A1 * | 4/2021 | Liaw | H01L 29/0673 |

* cited by examiner

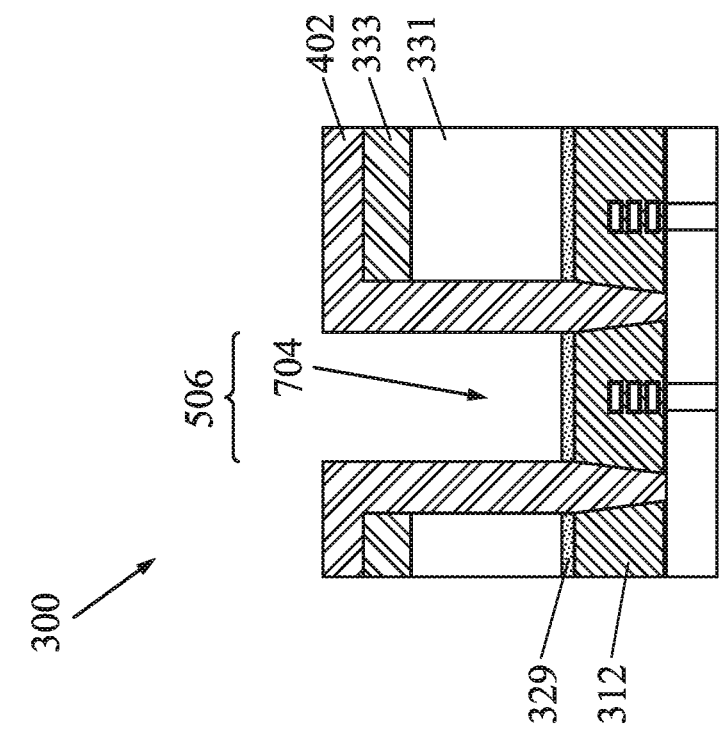
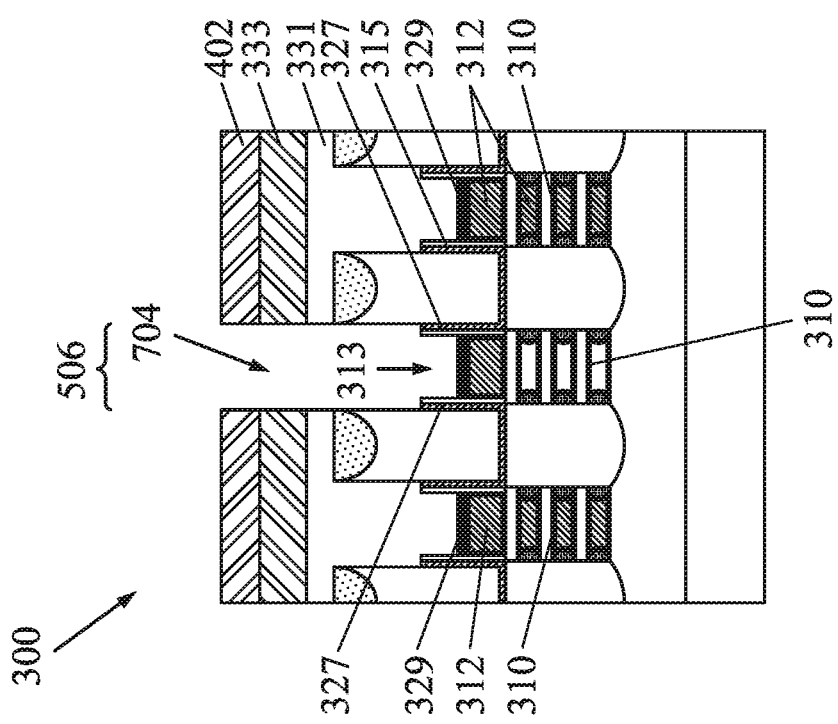
FIG. 7B
FIG. 7A

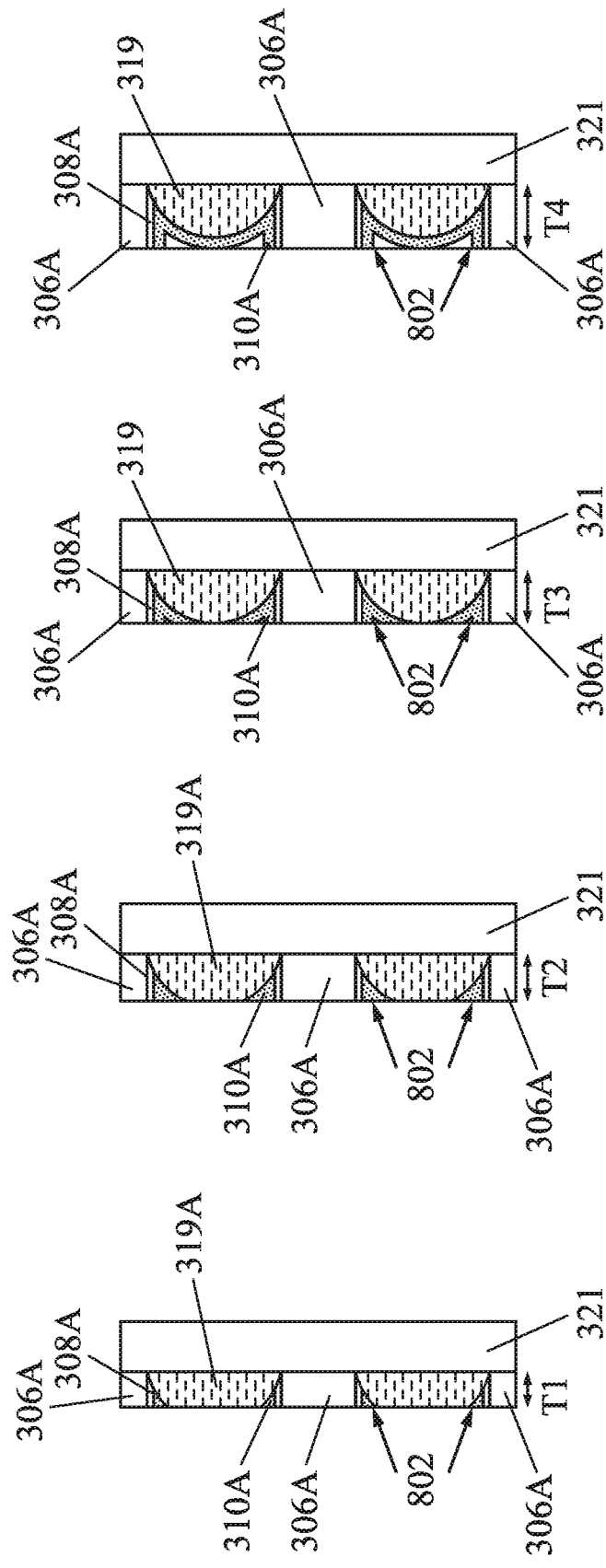

MULTI-GATE DEVICE AND RELATED METHODS

CROSS-REFERENCE TO RELATED APPLICATION

This application is a continuation of U.S. patent application Ser. No. 16/947,377, filed Jul. 30, 2020, issuing as U.S. Pat. No. 11,296,082, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA devices get their name from the gate structure which extends completely around the channel, providing better electrostatic control than FinFETs. FinFETs and GAA devices are compatible with conventional complementary metal-oxide-semiconductor (CMOS) processes and their three-dimensional structure allows them to be aggressively scaled while maintaining gate control and mitigating SCEs.

To continue to provide the desired scaling and increased density for multi-gate devices in advanced technology nodes, continued reduction of the contacted poly pitch (CPP) (or "gate pitch") is necessary. In at least some existing implementations, a continuous poly on diffusion edge (CPODE) process has been used to scale the CPP. By way of example, a CPODE process may be used to provide isolation between neighboring active regions (e.g., device regions including source, drain, and gate structures). However, in some cases, source/drain epitaxial layers disposed next to a CPODE region may be damaged during a CPODE etching process, thereby compromising device performance and reliability. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, and 10A provide cross-sectional views of an embodiment of a semiconductor device 300 along a plane substantially parallel to a plane defined by section XX' of FIG. 1, according to various stages of the method of FIG. 2;

FIGS. 3B, 4B, 5B, 6B, 7B, 8B, 9B, and 10B provide cross-sectional views of an embodiment of the semiconductor device 300 along a plane substantially parallel to a plane defined by section YY' of FIG. 1, according to various stages of the method of FIG. 2; and FIGS. 9C, 9D, 9E, and 9F provide enlarged views of a portion of the semiconductor device 300, corresponding to different spacer layer thicknesses, in accordance with some embodiments.

DETAILED DESCRIPTION

Figure 1:
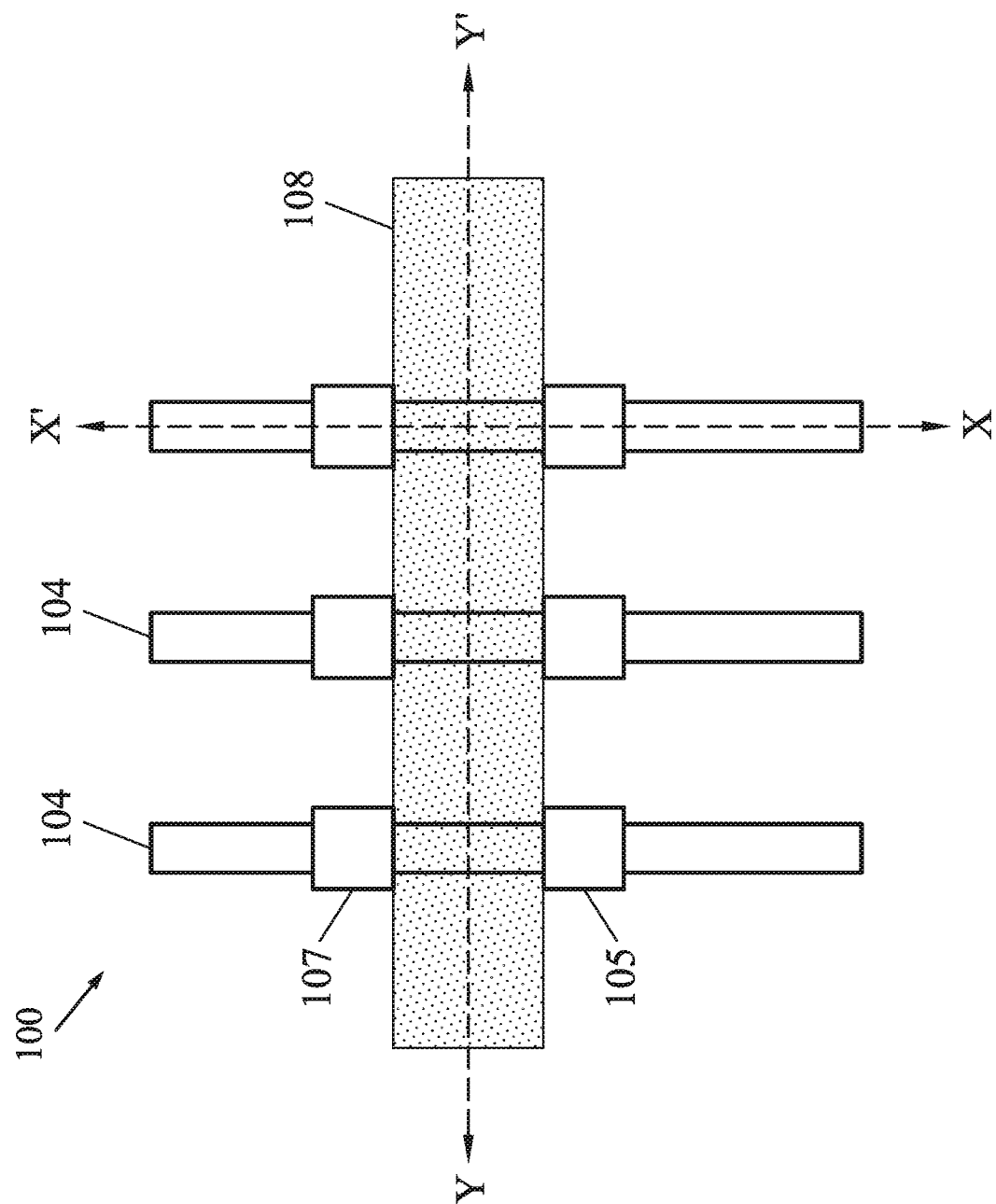
FIG. 1 illustrates a simplified top-down layout view of a multi-gate device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configurations. Presented herein are embodiments of devices that may have one or more channel regions (e.g., nanowires/nanosheets) associated with a single, contiguous gate structure. However, one of ordinary skill would recognize that the teaching can apply to a single channel (e.g., single nanowire/nanosheet) or any number of channels. One of ordinary skill may recognize other examples of semiconductor devices that may benefit from aspects of the present disclosure.

Continuing to provide the desired scaling and increased density for multi-gate devices in advanced technology nodes calls for scaling of the contacted poly pitch (CPP) (or "gate pitch"). In at least some existing implementations, a continuous poly on diffusion edge (CPODE) process has been used to scale the CPP. For purposes of this disclosure, a "diffusion edge" may be equivalently referred to as an active edge, where for example an active edge abuts adjacent active regions. Further, an active region includes a region where transistor structures are formed (e.g., including source, drain, and gate/channel structures). In some examples, active regions may be disposed between insulating regions. The CPODE process may provide an isolation region between neighboring active regions, and thus neighboring transistors, by performing a dry etching process along an active edge (e.g., at a boundary of adjacent active regions) to form a cut region and filling the cut region with a dielectric, such as silicon nitride (SiN).

Before the CPODE process, the active edge may include a dummy GAA structure having a gate stack and a plurality of channels (e.g., nanowire/nanosheet channels). The plurality of channels may each include a chemical oxide layer formed thereon, and high-K dielectric/metal gate layers may be formed over the chemical oxide layer and between adjacent channels of the plurality of channels. In addition, inner spacers may be disposed between adjacent channels at lateral ends of the plurality of channels. In various examples, source/drain epitaxial (epi) layers of adjacent active regions are disposed on either side of the dummy GAA structure (formed at the active edge), such that the adjacent source/drain epi layers are in contact with the inner spacers and plurality of channels of the dummy GAA structure. Just prior to the CPODE etching process, a metal gate etching process may be performed to remove the metal gate layer from the dummy GAA structure.

However, in at least some existing implementations, the metal gate etching process may also remove the high-K dielectric of the dummy GAA structure. Thus, after the metal gate etching process, the dummy GAA structure includes the plurality of channels with the chemical oxide layer formed thereon and the inner spacers disposed between adjacent channels. In particular, the dummy GAA structure has weak spots between the nanowire/nanosheet channels and the inner spacers, where only a thin (e.g., ~1 nm) portion of the chemical oxide layer remains disposed next to the source/drain epi layers of the adjacent active regions. As a result, during the subsequent CPODE dry etching process to form the cut region along the active edge, the adjacent source/drain epi layers may be damaged in the region of these weak spots, where only the thin (e.g., ~1 nm) portion of the chemical oxide layer remains to resist the CPODE dry etching process and protect the adjacent source/drain epi layers. As a result, device performance and reliability of a transistor formed in the adjacent active region, using the damaged source/drain epitaxial layer, will be degraded. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and related methods for performing a CPODE process without damaging source/drain epi layers of active regions adjacent to an active edge, as well as related structures. In various embodiments, a dummy GAA structure may be formed at an active edge (e.g., at a boundary of adjacent active regions), as described above, with source/drain epi layers of adjacent active regions disposed on either side of the dummy GAA structure. In some embodiments, and prior to the CPODE etching process, a metal gate etching process may be performed to remove the metal gate layer from the dummy GAA structure. However, in contrast to at least some existing implementations, the metal gate etching process does not remove the high-K dielectric of the dummy GAA structure. Stated another way, the metal gate etching process selectively removes the metal gate layer without removing the high-K dielectric. By way of example, the selective metal gate etching process includes a wet etching process. In some embodiments, the selective wet etching process may include a combination of ammonium hydroxide ($NH_4OH$), hydrogen peroxide ($H_2O_2$), and water ($H_2O$). Thus, in various embodiments and after the metal gate etching process, regions of the dummy GAA structure between the nanowire/nanosheet channels and the inner spacers include both the unremoved high-K dielectric and the thin (e.g., ~1 nm) portion of the chemical oxide layer disposed next to the source/drain epi layers of the adjacent active regions. The unremoved high-K dielectric thus provides another layer, in addition to the chemical oxide layer, to resist the CPODE dry etching process and effectively mitigate weak spots, present in at least some conventional processes, as noted above. As a result, in some embodiments and during the subsequent CPODE dry etching process to form the cut region along the active edge, damage to the adjacent source/drain epi layers will be effectively reduced or eliminated. By employing the disclosed CPODE process, a CPODE process window is enlarged and device performance and reliability of transistors formed in the adjacent active regions will be enhanced. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section XX' of FIG. 1. In some embodiments, sidewall spacers may also be formed on sidewalls of the gate structure 108. Various other features of the multi-gate device 100 are discussed in more detail below with reference to the method of FIG. 2.

Figure 2:
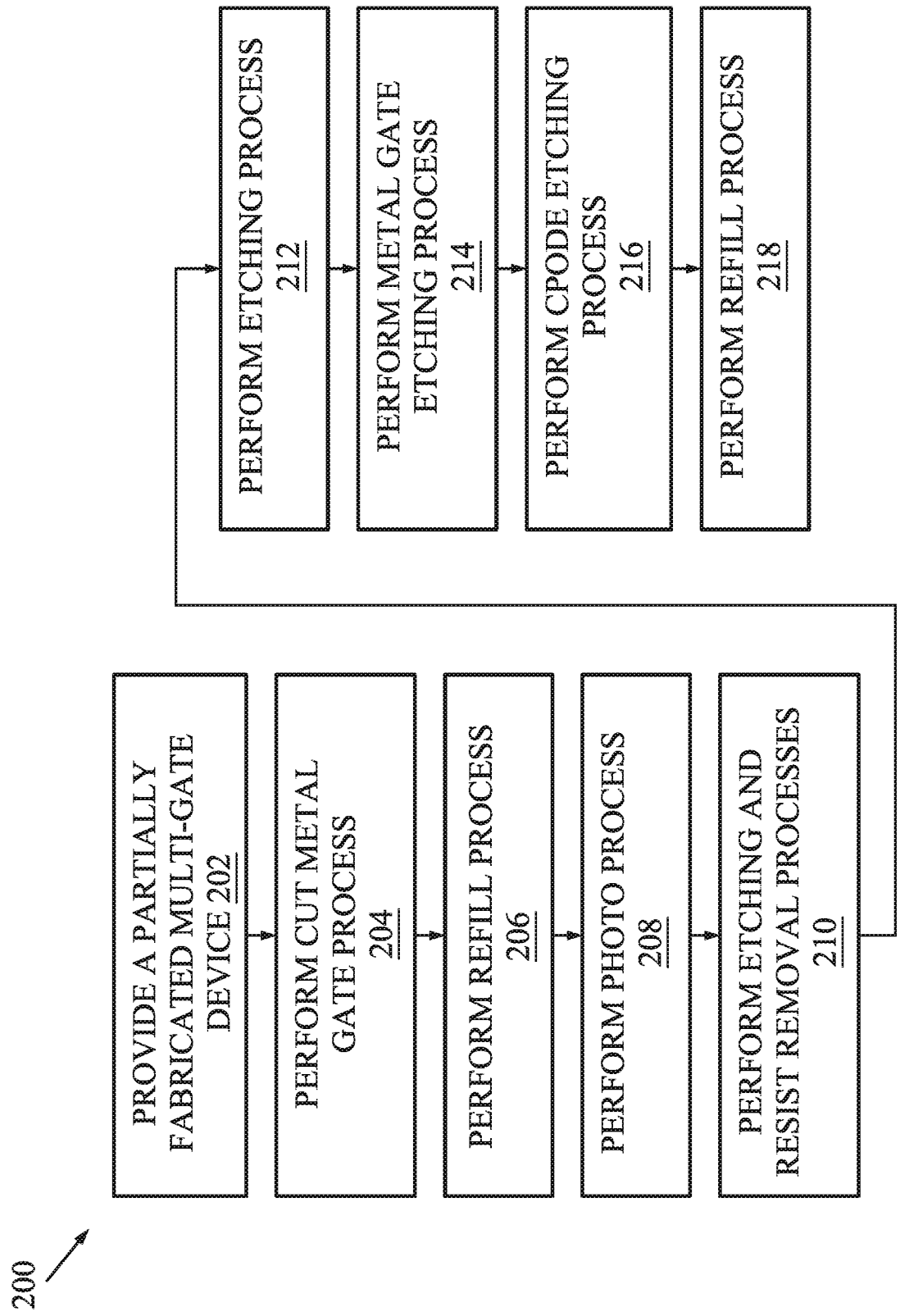
FIG. 2 is a flow chart of a method of fabricating a multi-gate device according to one or more aspects of the present disclosure.

Referring to FIG. 2, illustrated therein is a method 200 of fabrication of a semiconductor device 300 (e.g., which includes a multi-gate device) using a CPODE process, in accordance with various embodiments. The method 200 is discussed below with reference to a GAA device having a channel region that may be referred to as a nanosheet and which may include various geometries (e.g., cylindrical, bar-shaped) and dimensions. However, it will be understood that aspects of the method 200, including the disclosed CPODE process, may be equally applied to other types of multi-gate devices (e.g., such as FinFETs or devices including both GAA devices and FinFETs) without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

Figure 3B:
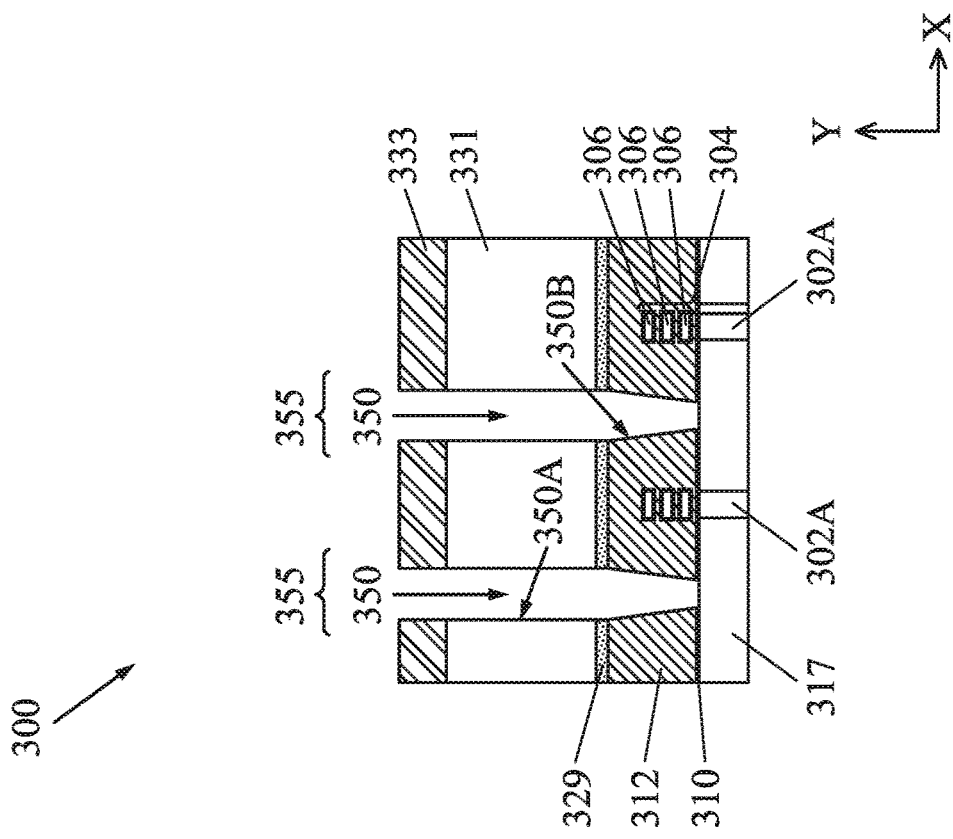
Figure 3A:
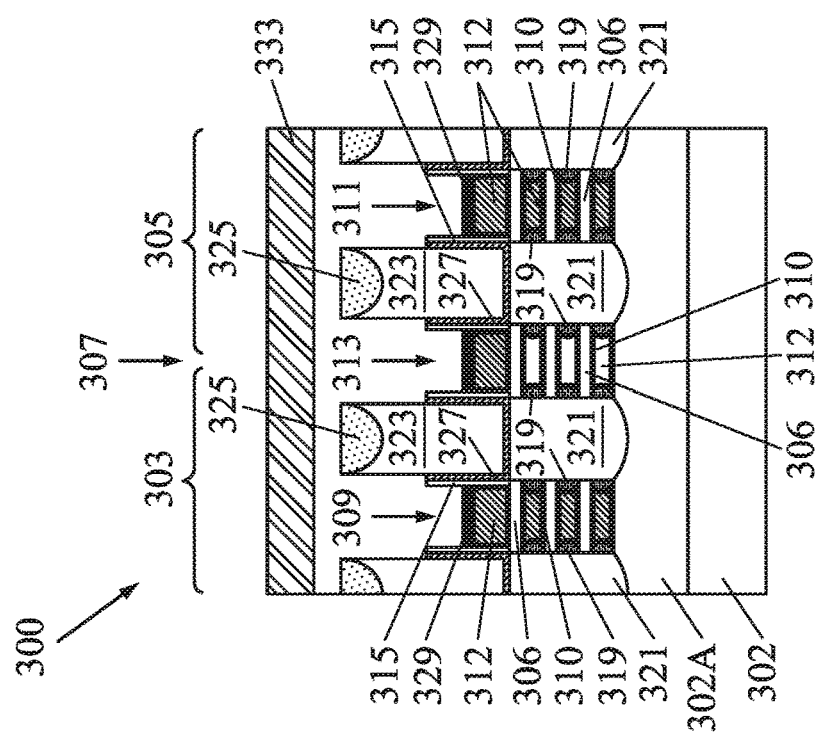

The method 200 is described below with reference to FIGS. 3A/3B, 4A/4B, 5A/5B, 6A/6B, 7A/7B, 8A/8B, 9A/9B, and 10A/10B which illustrate the semiconductor device 300 at various stages of fabrication according to the method 200. FIGS. 3A, 4A, 5A, 6A, 7A, 8A, 9A, and 10A provide cross-sectional views of an embodiment of the semiconductor device 300 along a plane substantially parallel to a plane defined by section XX' of FIG. 1. FIGS. 3B, 4B, 5B, 6B, 7B, 8B, 9B, and 10B provide cross-sectional views of an embodiment of the semiconductor device 300 along a plane substantially parallel to a plane defined by section YY' of FIG. 1.

Further, the semiconductor device 300 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the inventive concepts of the present disclosure. In some embodiments, the semiconductor device 300 includes a plurality of semiconductor devices (e.g., transistors), including PFETs, NFETs, etc., which may be interconnected. Moreover, it is noted that the process steps of method 200, including any descriptions given with reference to the figures are merely exemplary and are not intended to be limiting beyond what is specifically recited in the claims that follow.

The method 200 begins at block 202 where a partially fabricated multi-gate device is provided. Referring to the example of FIGS. 3A and 3B, in an embodiment of block 202, a device 300 includes a first active region 303, a second active region 305, and an active edge 307 that is defined at a boundary of the first active region 303 and the second active region 305. In some embodiments, the first active region 303 includes a first GAA device 309, the second active region 305 includes a second GAA device 311, and the active edge 307 includes a dummy GAA structure 313, as described below. In accordance with embodiments of the present disclosure, a CPODE process may provide an isolation region between the first active region 303 and the second active region 305, and thus between the first and second GAA devices 309, 311, by performing a dry etching process along the active edge 307 to form a cut region and filling the cut region with a dielectric, as described in more detail below.

Each of the first GAA device 309, the second GAA device 311, and the dummy GAA structure 313 are formed on a substrate 302 having fins 304. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epi layer, may be strained for performance enhancement, may include a silicon-on-insulator (SOI) structure, and/or have other suitable enhancement features.

The fins 304 may include nanosheet channel layers 306. In some embodiments, the nanosheet channel layers 306 may include silicon (Si). However, in some embodiments, the nanosheet channel layers 306 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, the nanosheet channel layers 306 may be epitaxially grown by a molecular beam epitaxy (MBE) process, a metalorganic chemical vapor deposition (MOCVD) process, and/or other suitable epitaxial growth processes.

With reference to the X and Y dimensions of the nanosheet channel layers 306 from an end-view of the nanosheet channel layers 306 (e.g., FIG. 3B), the X-dimension may be equal to about 5-14 nm, and the Y-dimension may be equal to about 5-8 nm. In some cases, the X-dimension of the nanosheet channel layers 306 is substantially the same as the Y-dimension of the nanosheet channel layers 306. By way of example, the nanosheet channel layers 306 may be referred to as "nanosheets" when the X-dimension is greater than the Y-dimension. In some cases, a spacing (e.g., along the Y-direction) between adjacent nanosheet channel layers 306 is equal to about 4-8 nm.

In various embodiments, each of the fins 304 includes a substrate portion 302A formed from the substrate 302 and the nanosheet channel layers 306. It is noted that while the fins 304 are illustrated as including three (3) nanosheet channel layers 306, this is for illustrative purposes only and is not intended to be limiting beyond what is specifically recited in the claims. It can be appreciated that any number of nanosheet channel layers 306 can be formed, where for example, the number of nanosheet channel layers 306 depends on the desired number of channels regions for the GAA device (e.g., the device 300). In some embodiments, the number of nanosheet channel layers 306 is between 3 and 10.

Shallow trench isolation (STI) features 317 may also be formed interposing the fins 304. In some embodiments, the STI features 317 include $SiO_2$, silicon nitride, silicon oxynitride, fluorine-doped silicate glass (FSG), a low-k dielectric, combinations thereof, and/or other suitable materials known in the art. In various examples, the dielectric layer used to form the STI features 317 may be deposited by a CVD process, a subatmospheric CVD (SACVD) process, a flowable CVD process, an ALD process, a PVD process, and/or other suitable process.

In various examples, each of the first GAA device 309, the second GAA device 311, and the dummy GAA structure 313 of the device 300 further includes a gate structure, which may include a high-K/metal gate stack. In some embodiments, the gate structure may form the gate associated with the multi-channels provided by the nanosheet channel layers 306 in the channel region of the first GAA device 309 and the second GAA device 311. The gate structure may include an interfacial layer (IL) 308 (which is better illustrated in FIGS. 8A/8B) and a high-K gate dielectric layer 310 formed over the interfacial layer 308. In some embodiments, the gate dielectric has a total thickness of about 1-5 nm. High-K gate dielectrics, as used and described herein, include dielectric materials having a high dielectric constant, for example, greater than that of thermal silicon oxide (~3.9).

In some embodiments, the interfacial layer 308 may include a dielectric material such as silicon oxide ($SiO_2$), HfSiO, or silicon oxynitride (SiON). The interfacial layer 308 may be formed by chemical oxidation, thermal oxidation, atomic layer deposition (ALD), chemical vapor deposition (CVD), and/or other suitable method. In some examples, the interfacial layer 308 includes the chemical oxide layer, discussed above. The high-K gate dielectric layer 310 may include a high-K dielectric material such as hafnium oxide ($HfO_2$). Alternatively, the high-K gate dielectric layer 310 may include other high-K dielectric materials, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 310 may be formed by ALD, physical vapor deposition (PVD), CVD, oxidation, and/or other suitable methods.

The gate structure may further include a metal gate having a metal layer 312 formed over the gate dielectric (e.g. over the IL 308 and the high-K gate dielectric layer 310). The metal layer 312 may include a metal, metal alloy, or metal silicide. The metal layer 312 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 312 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 312 may be formed by ALD, PVD, CVD, e-beam evaporation, or other suitable process. Further, the metal layer 312 may be formed separately for N-type and P-type transistors which may use different metal layers. In addition, the metal layer 312 may provide an N-type or P-type work function, may serve as a transistor gate electrode, and in at least some embodiments, the metal layer 312 may include a polysilicon layer. As shown in FIG. 3A, the gate structure includes portions that interpose each of the nanosheet channel layers 306 of the fins 304, where the nanosheet channel layers 306 each provide semiconductor channel layers for the first GAA device 309 and the second GAA device 311.

In some examples, a metal layer 329 may be formed over the metal layer 312, as shown. In some embodiments, the metal layer 329 includes selectively-grown tungsten (W), although other suitable metals may also be used. In at least some examples, the metal layer 329 includes a fluorine-free W (FFW) layer. In various examples, the metal layer 329 may serve as an etch-stop layer and may also provide reduced contact resistance (e.g., to the metal layer 312).

In some embodiments, a spacer layer 315 may be formed on sidewalls of a top portion of the gate structure of each of the first GAA device 309, the second GAA device 311, and the dummy GAA structure 313. The spacer layer 315 may be formed prior to formation of the high-K/metal gate stack of the gate structure. For example, in some cases, the spacer layer 315 may be formed on sidewalls of a previously formed dummy (sacrificial) gate stack that is removed and replaced by the high-K/metal gate stack, described above, as part of a replacement gate (gate-last) process. In some cases, the spacer layer 315 may have a thickness of about 2-10 nm. In various embodiments, the thickness of the spacer layer 315 may be selected to provide a desired sidewall profile following a subsequent CPODE dry etching process, as discussed in more detail below. In some examples, the spacer layer 315 may include a dielectric material such as silicon oxide, silicon nitride, silicon carbide, silicon oxynitride, SiCN, silicon oxycarbide, SiOCN, SiOHCN, a low-K material (e.g., with a dielectric constant 'k'<7), and/or combinations thereof. In some embodiments, the spacer layer 315 includes multiple layers, such as main spacer layers, liner layers, and the like.

In various examples, each of the first GAA device 309, the second GAA device 311, and the dummy GAA structure 313 of the device 300 further includes inner spacers 319. The inner spacers 319 may be disposed between adjacent channels of the nanosheet channel layers 306, at lateral ends of the nanosheet channel layers 306, and in contact with portions of the gate structure that interpose each of the nanosheet channel layers 306. In some embodiments, the inner spacers 319 include amorphous silicon. In some examples, the inner spacers 319 may include silicon oxide, silicon nitride, silicon carbide, silicon oxynitride, SiCN, silicon oxycarbide, SiOCN, a low-K material (e.g., with a dielectric constant 'k'<7), and/or combinations thereof. In various examples, the inner spacers 319 may extend beneath the spacer layer 315, described above, while abutting adjacent source/drain features, described below.

In some embodiments, source/drain features 321 are formed in source/drain regions adjacent to and on either side of the gate structure of each of the first GAA device 309 and the second GAA device 311 and over the substrate portion 302A. As a result, the dummy GAA structure 313 is disposed between a first source/drain feature 321 of the first GAA device 309 (in the first active region 303) and a second source/drain feature 321 of the second GAA device 311 (in the second active region 305). As shown, the source/drain features 321 of the first GAA device 309 are in contact with the inner spacers 319 and nanosheet channel layers 306 of the first GAA device 309, and the source/drain features 321 of the second GAA device 311 are in contact with the inner spacers 319 and nanosheet channel layers 306 of the second GAA device 311. Moreover, the source/drain features 321 (of the first and second GAA devices 309, 311) disposed on either side of the dummy GAA structure 313 are in contact with the inner spacers 319 and nanosheet channel layers 306 of the dummy GAA structure 313.

In various examples, the source/drain features 321 include semiconductor epi layers such as Ge, Si, GaAs, AlGaAs, SiGe, GaAsP, SiP, or other suitable material, which may be formed by one or more epitaxial processes. In some embodiments, the source/drain features 321 may be in-situ doped during the epi process. For example, in some embodiments, epitaxially grown SiGe source/drain features may be doped with boron. In some cases, epitaxially grown Si source/drain features may be doped with carbon to form Si:C source/drain features, phosphorous to form Si:P source/drain features, or both carbon and phosphorous to form SiCP source/drain features. In some embodiments, the source/drain features 321 are not in-situ doped, and instead an implantation process is performed to dope the source/drain features 321. In some embodiments, formation of the source/drain features 321 may be performed in separate processing sequences for each of N-type and P-type source/drain features.

An inter-layer dielectric (ILD) layer 323 may also be formed over the device 300. In some embodiments, a contact etch stop layer (CESL) 327 is formed over the device 300 prior to forming the ILD layer 323. In some examples, the CESL 327 includes a silicon nitride layer, silicon oxide layer, a silicon oxynitride layer, and/or other materials known in the art. The CESL 327 may be formed by plasma-enhanced chemical vapor deposition (PECVD) process and/or other suitable deposition or oxidation processes. In some embodiments, the ILD layer 323 includes materials such as tetraethylorthosilicate (TEOS) oxide, un-doped silicate glass, or doped silicon oxide such as borophosphosilicate glass (BPSG), FSG, phosphosilicate glass (PSG), boron doped silicon glass (BSG), and/or other suitable dielectric materials. The ILD layer 323 may be deposited by a PECVD process or other suitable deposition technique. In some embodiments, a hard mask layer 325 may be formed over the ILD layer 323. In some cases, the hard mask layer 325 may include SiN. In various examples, the ILD layer 323 and the hard mask layer 325 may be patterned, resulting in the structure of FIG. 3A, as part of a process used to remove the previously formed dummy (sacrificial) gate stack and replace it with the high-K/metal gate stack.

In some cases, a material layer 331 may further be formed over the device 300, including over the metal layer 329. In some embodiments, the material layer 331 includes silicon (Si). However, in some examples, the material layer 331 may include a dielectric material such as silicon oxide, silicon nitride, silicon carbide, silicon oxynitride, combinations thereof, or another suitable material. In addition, a nitride layer 333 may be formed over the material layer 331. In some embodiments, the nitride layer 333 includes SiN. The nitride layer 333 may also be used as a hard mask layer.

The method 200 then proceeds to block 204 where a cut metal gate (CMG) process is performed. With reference to FIG. 3B, in an embodiment of block 204 and after forming the nitride layer 333, a cut metal gate process is performed to isolate the metal layers 312 of adjacent structures. By way of example, a photolithography and etch process may be performed to etch portions of the nitride layer 333, the material layer 331, the metal layer 329, the metal layer 312, and the high-K gate dielectric layer 310 to form trenches 350 in cut metal gate regions 355. In some embodiments, formation of the trenches 350 exposes portions of the underlying STI features 317. In various examples, the trenches 350 may be etched using a dry etch (e.g., reactive ion etching), a wet etch, or a combination thereof. In addition, as shown in FIG. 3B, the trenches 350 may have a sidewall profile with a substantially vertical profile 350A along an upper portion of the trenches 350, and a tapered profile 350B along a lower portion of the trenches 350. In some embodiments, tapering the trenches 350 to form the tapered profile 350B along the lower portion of the trenches 350 may be performed to increase a spacing between the nanosheet channel layers 306 in adjacent active regions and the trenches 350 (e.g., to protect the nanosheet channel layers 306 from potential damage during the etching process and/or to improve the isolation between neighboring active regions provided by the CPODE process, as described in more detail below).

The method 200 then proceeds to block 206 where a refill process is performed. With reference to FIGS. 3A/3B and 4A/4B, in an embodiment of block 206, a refill process is used to form a nitride layer 402 over the device 300, including over the nitride layer 333. The nitride layer 402 is also used to fill the previously formed trenches 350 and electrically isolate the metal layers 312 of adjacent structures. In some embodiments, the nitride layer 402 includes SiN. Alternatively, in some cases, the nitride layer 402 may include $SiO_2$, silicon oxynitride, FSG, a low-k dielectric, combinations thereof, and/or other suitable materials known in the art. In various examples, the nitride layer 402 may be deposited by a CVD process, an SACVD process, a flowable CVD process, an ALD process, a PVD process, and/or other suitable process. In some cases, after depositing the nitride layer 402, a chemical mechanical polishing (CMP) process may be performed to remove excess material and planarize a top surface of the device 300.

Figure 4B:
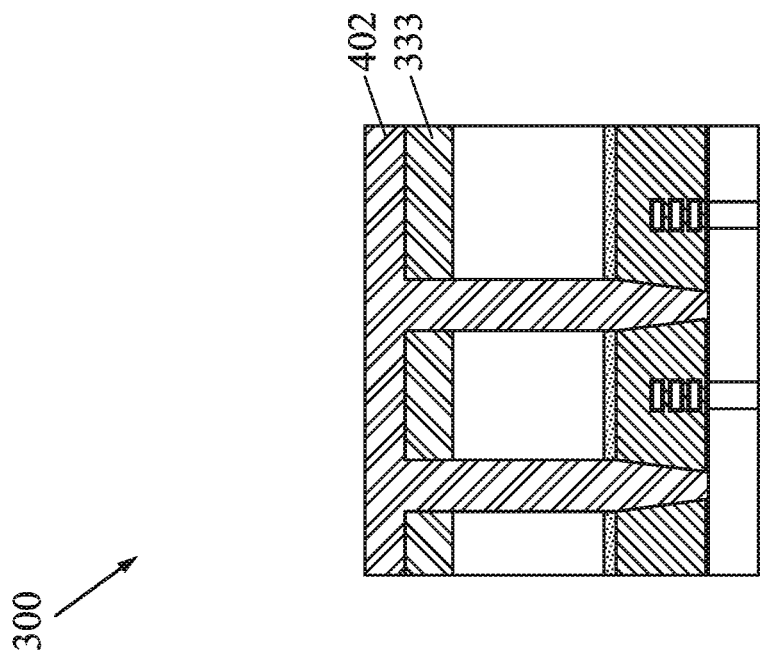
Figure 4A:
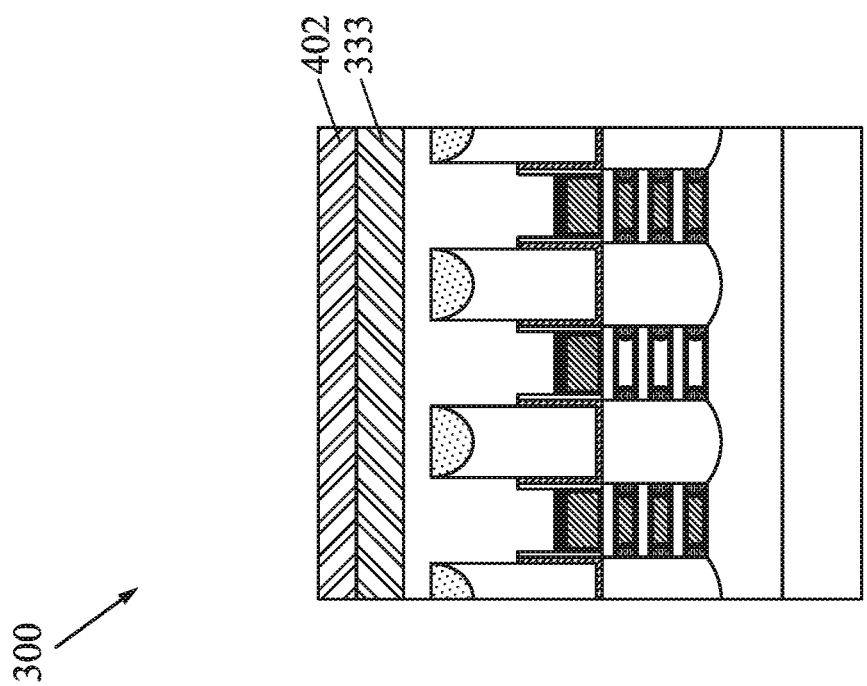

The method 200 then proceeds to block 208 where a photolithography (photo) process is performed. With reference to FIGS. 4A/4B and 5A/5B, in an embodiment of block 208, a photoresist (resist) layer is deposited (e.g., using a spin-coating process) over the device 300 and patterned to form a patterned resist layer 502 that exposes a portion of the nitride layer 402. In various embodiments, the photo process used to form the patterned resist layer 502 may also include other steps such as soft baking, mask aligning, exposure, post-exposure baking, developing, rinsing, drying (e.g., spin-drying and/or hard baking), other suitable lithography processes, and/or combinations thereof. In some embodiments, the photo process of block 208 may include a CPODE photo process, where the patterned resist layer 502 provides an opening 504 in a CPODE region 506 that exposes the portion of the nitride layer 402. In addition, the CPODE region 506 may include the active edge 307 and the dummy GAA structure 313, discussed above with reference to FIG. 3A.

Figure 5B:
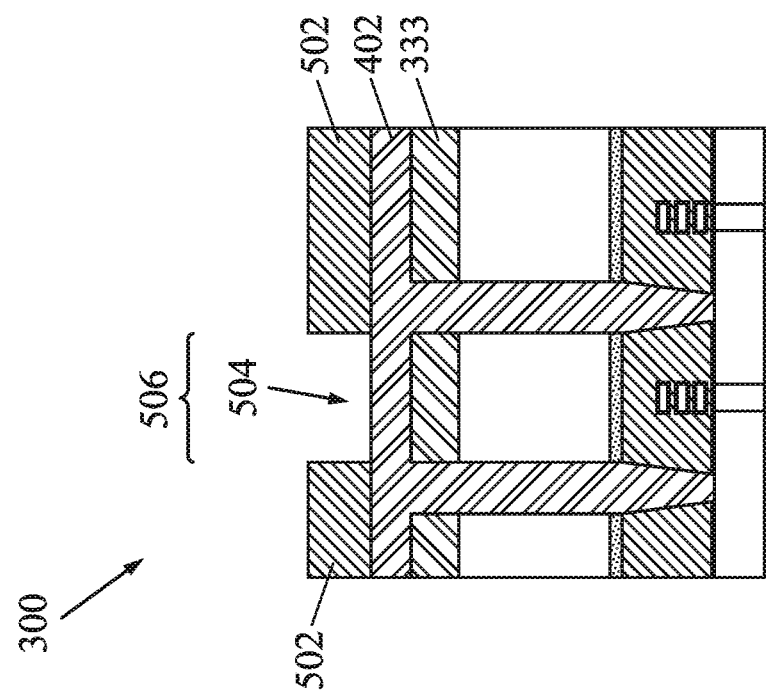
Figure 5A:
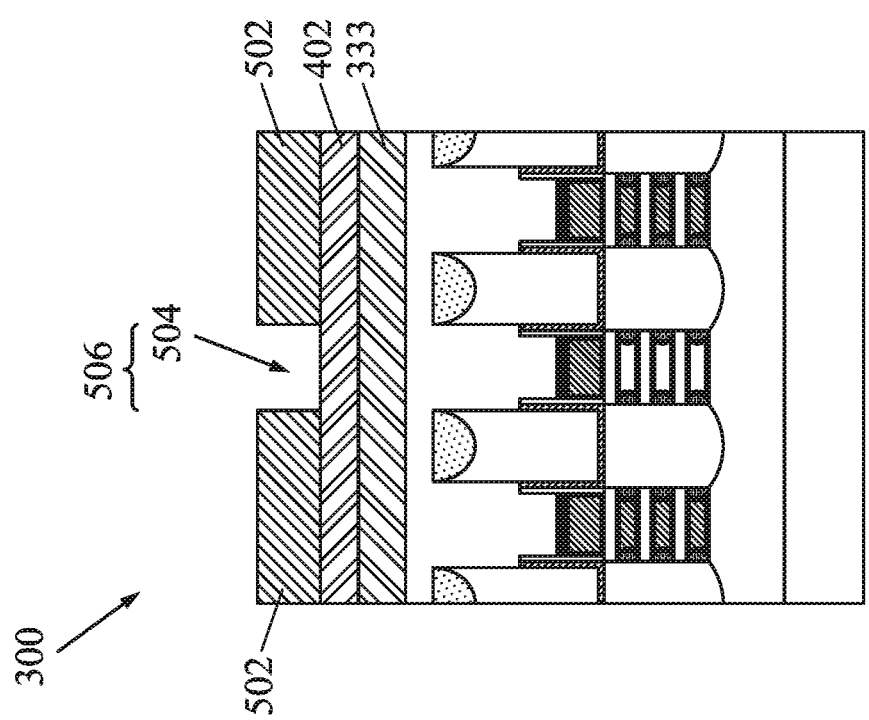

The method 200 then proceeds to block 210 where etching and resist removal processes are performed. With reference to FIGS. 5A/5B and 6A/6B, in an embodiment of block 210, an etching process is performed to remove portions of the nitride layer 402 and the nitride layer 333 (e.g., in a region exposed by the opening 504 in the patterned resist layer 502) to form an opening 604. Thus, in some examples, the etching process of block 210 may be referred to as a SiN etching process, a hard mask etching process, or a SiN hard mask etching process. In various embodiments, the opening 604 formed by the etching process may expose a portion of the material layer 331 within the CPODE region 506. In some examples, the etching process may include a dry etching process, a wet etching process, and/or a combination thereof. After the etching process, and in a further embodiment of block 210, the patterned resist layer 502 may be removed, for example, by way of a solvent, resist stripper, ashing, or other suitable technique.

Figures 6A, 6B:
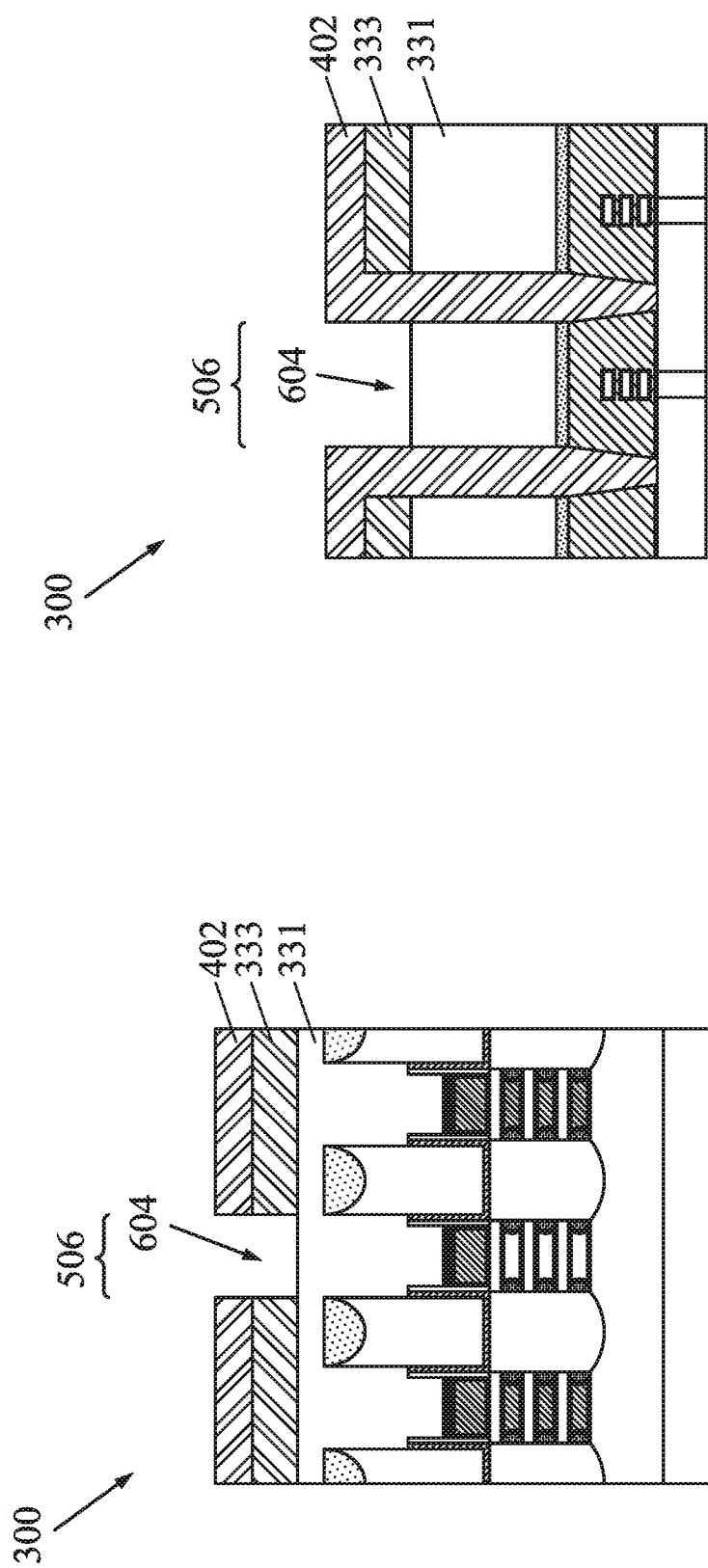

The method 200 then proceeds to block 212 where an etching process is performed. With reference to FIGS. 6A/6B and 7A/7B, in an embodiment of block 212, an etching process is performed to remove portions of the material layer 331 (e.g., in a region exposed by the opening 604) to form an opening 704. In various embodiments, for example when the material layer 331 includes silicon (Si), the etching process of block 212 may include a Si etching process or a Si dry etching process. In some examples, the opening 704 formed by the etching process of block 212 may expose the dummy gate GAA structure 313 within the CPODE region 506. In particular, the opening 704 may expose the metal layer 329, portions of the spacer layer 315, and in some cases portions of the CESL 327 within the CPODE region 506. In some examples, the etching process of block 212 may include a dry etching process, a wet etching process, and/or a combination thereof.

The method 200 then proceeds to block 214 where a metal gate etching process is performed. With reference to FIGS. 7A/7B and 8A/8B, in an embodiment of block 214, the metal gate etching process includes removal of the metal layer 312 from the dummy GAA structure 313. For clarity of the discussion that follows, FIGS. 8A/8B include enlarged views of portions of the device 300, as indicated by the dashed lines. In some embodiments, the metal gate etching process also includes removal of the metal layer 329 either prior to, or during, the removal of the metal layer 312. The metal gate etching process may be performed through the opening 704, resulting in an opening 804. In various embodiments, removal of one or both of the metal layers 312, 329 may include a wet etching process. By way of example, the wet etching process may include a combination of ammonium hydroxide ($NH_4OH$), hydrogen peroxide ($H_2O_2$), and water ($H_2O$). In accordance with embodiments of the present disclosure, the wet etching process of block 214 removes the metal layers 312, 329 without removing the high-K gate dielectric layer 310 of the dummy GAA structure 313. Stated another way, the wet etching process selectively removes the metal layers 312, 329 without removing the high-K gate dielectric layer 310. Thus, the wet etching process of block 214 may be referred to as a selective etching process or a selective wet etching process. It is noted that the wet etching process may remove the metal layers 312 from a top portion of the dummy GAA structure 313, as well as between adjacent channels of the nano sheet channel layers 306.

After the metal gate etching process of block 214, regions 802 of the dummy GAA structure 313 between the nanosheet channel layers 306 and the inner spacers 319 (e.g., at a top or bottom edge of the inner spacers 319) include both the unremoved high-K gate dielectric layer 310 and interfacial layer 308 disposed next to the source/drain feature 321 of an adjacent device (e.g., the first GAA device 309 and the second GAA device 311) in an adjacent active region (e.g., the first active region 303 and the second active region 305). In some cases, the regions 802 may be referred to as a channel layer-inner spacer interface. The unremoved high-K gate dielectric layer 310 thus provides another layer, in addition to the interfacial layer 308, to resist the CPODE dry etching process and effectively mitigate weak spots, present in at least some conventional processes, as previously noted. As a result, in some embodiments and during the subsequent CPODE dry etching process to form the cut region along the active edge 307, damage to the adjacent source/drain features 321 will be effectively reduced or eliminated. As such, device performance and reliability of transistors (e.g., the first GAA device 309 and the second GAA device 311) formed in the adjacent active regions will be enhanced.

Figures 8A, 8B:
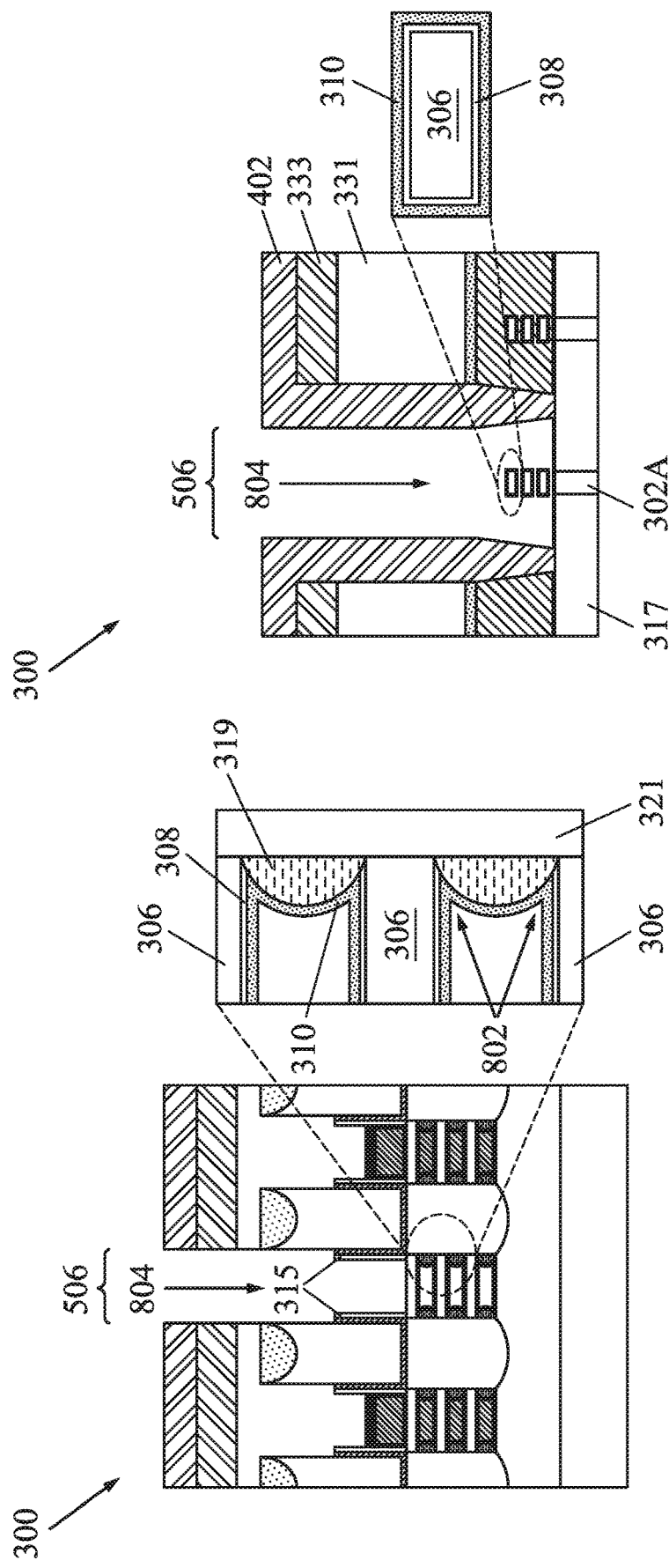

The method 200 then proceeds to block 216 where a CPODE etching process is performed. With reference to FIGS. 8A/8B and 9A/9B, in an embodiment of block 216, the CPODE etching process etches the device 300 through the opening 804 within the CPODE region 506 to form a trench 904. In some cases, the CPODE etching process includes a dry etching process. For clarity discussion, FIG. 9A includes an enlarged view of a portions of the device 300, as indicated by the dashed lines. In some embodiments, the CPODE etching process removes portions of the nanosheet channel layers 306, the inner spacers 319, the high-K gate dielectric layer 310, and the interfacial layer 308 within the CPODE region 506 that are not protected by (disposed directly below) the spacer layer 315. As a result, the trench 904 may include nanosheet channel layer portions 306A, inner spacer portions 319A, high-K gate dielectric layer portions 310A, and interfacial layer portions 308A along sidewalls (in a sidewall region) of the trench 904 and disposed between the trench 904 and the adjacent source/drain feature 321. In particular, the remaining high-K gate dielectric layer portions 310A further illustrate the benefit of the additional layer of protection provided by the unremoved high-K gate dielectric layer 310, in addition to the interfacial layer 308, to resist the CPODE dry etching process and effectively mitigate weak spots, thus preventing damage to the adjacent source/drain features 321. It is also noted that the CPODE etching process may, in addition to removing substantial portions of the nanosheet channel layers 306, remove the substrate portion 302A of the dummy GAA structure 313 within the CPODE region 506 to form a trench 906.

Figures 9A, 9B:
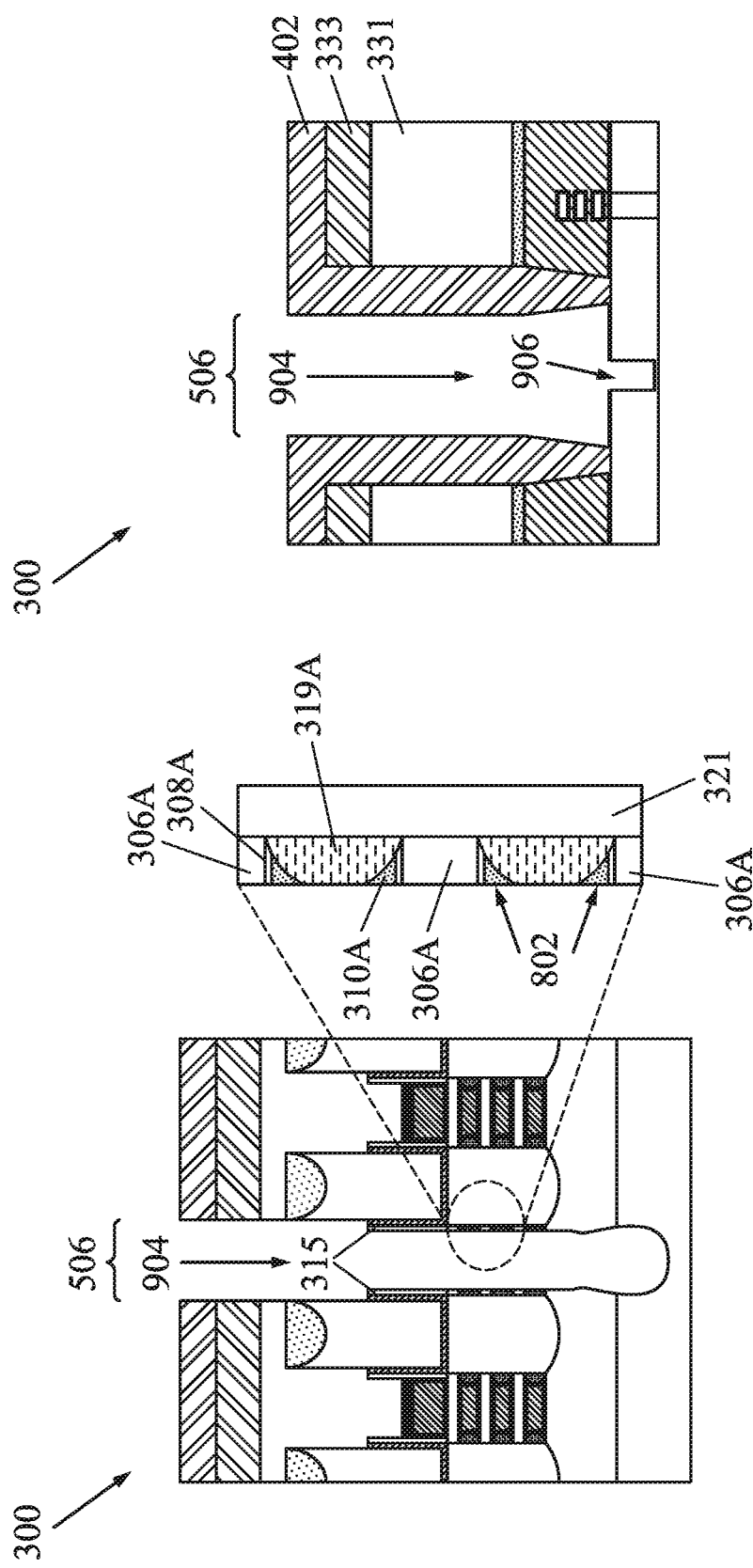
Figure 10B:
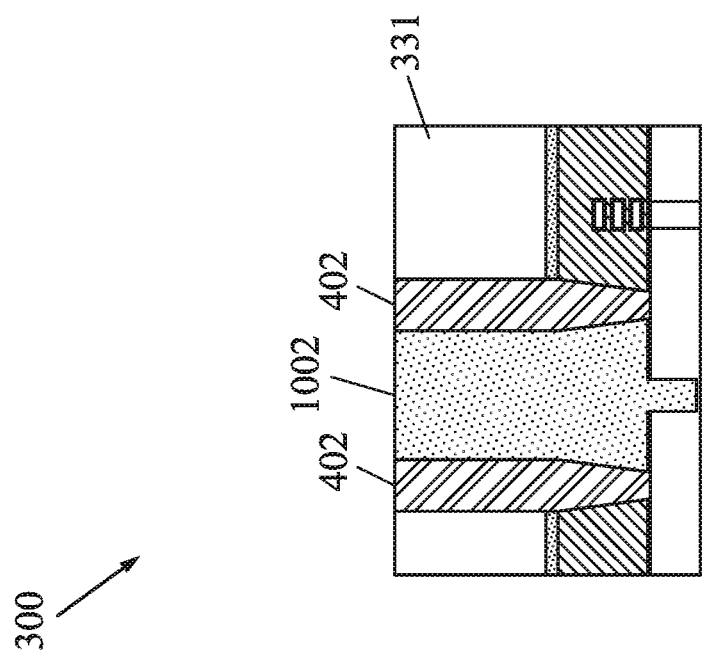
Figure 10A:
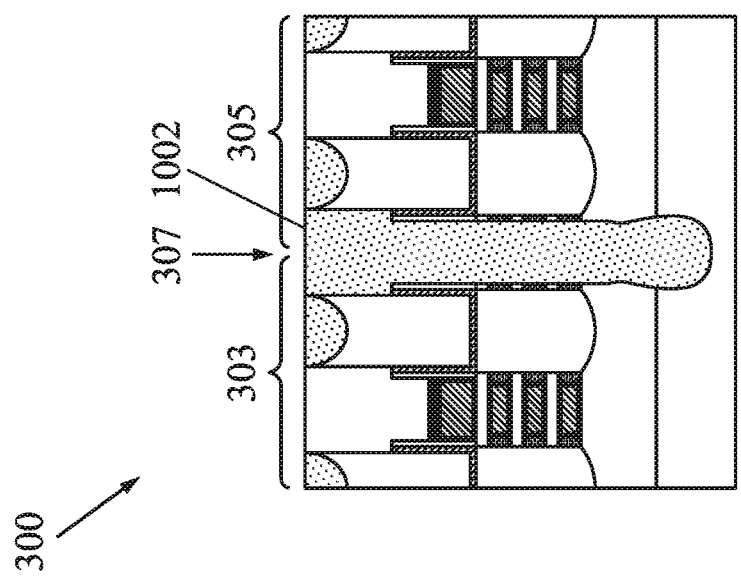

As previously discussed, the thickness of the spacer layer 315 may be selected to provide a desired sidewall profile following the CPODE etching process. For example, thicker spacer layers 315 may serve to protect greater portions of the nanosheet channel layers 306, the inner spacers 319, the high-K gate dielectric layer 310, and the interfacial layer 308 within the CPODE region 506 that are disposed beneath the spacer layer 315, as compared to thinner spacer layers 315. For purposes of illustration, reference is made to FIGS. 9C-9F. FIG. 9C may be the same as the enlarged portion of FIG. 9A (indicated by the dashed lines), discussed above, and FIG. 9C may correspond to a first spacer layer 315 thickness 'T1'. FIG. 9D may correspond to a second spacer layer 315 thickness 'T2', where T2 is greater than T1. FIG. 9E may correspond to a third spacer layer 315 thickness 'T3', where T3 is greater than T2. FIG. 9F may correspond to a fourth spacer layer 315 thickness 'T4', where T4 is greater than T3. As shown in FIGS. 9C-9F, greater or lesser amounts of each of the nanosheet channel layers 306, the inner spacers 319, the high-K gate dielectric layer 310, and the interfacial layer 308 remain after the CPODE etching process, depending on the thickness of the spacer layer 315, resulting in different amounts of resistance to the CPODE etching process for different spacer layer 315 thicknesses. Specifically, and in some embodiments, an amount of the high-K gate dielectric layer 310 that remains disposed at the channel layer-inner spacer interface corresponds to a thickness of the spacer layer 315. In some embodiments, the spacer layer 315 thickness, and resulting sidewall profile, may be chosen to provide more or less protection to adjacent source/drain features 321, depending on various device and/or process parameters and specifications.

The method 200 then proceeds to block 218 where a refill process is performed. With reference to FIGS. 9A/9B and 10A/10B, in an embodiment of block 218, a refill process is used to form a nitride layer 1002 over the device 300 and within the trench 904 formed by the CPODE etching process. The nitride layer 1002, and more generally the CPODE process described herein, thus provides an isolation region between the first active region 303 and the second active region 305, including between the first and second GAA devices 309, 311, by performing the CPODE etching process along the active edge 307 to form a cut region (the trench 904) and filling the cut region with the nitride layer 1002. In some embodiments, the nitride layer 1002 includes SiN. Alternatively, in some cases, the nitride layer 1002 may include $SiO_2$, silicon oxynitride, FSG, a low-k dielectric, combinations thereof, and/or other suitable materials known in the art. In various examples, the nitride layer 1002 may be deposited by a CVD process, an SACVD process, a flowable CVD process, an ALD process, a PVD process, and/or other suitable process. In some cases, after depositing the nitride layer 1002, a CMP process may be performed to remove excess material and planarize a top surface of the device 300.

Generally, the semiconductor device 300 may undergo further processing to form various features and regions known in the art. For example, subsequent processing may form contact openings, contact metal, as well as various contacts/vias/lines and multilayer interconnect features (e.g., metal layers and interlayer dielectrics) on the substrate 302, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200. Further, while the method 200 has been shown and described as including the device 300 having a GAA device, it will be understood that other device configurations are possible. In some embodiments, the method 200 may be used to fabricate FinFET devices or other multi-gate devices.

With respect to the description provided herein, disclosed are structures and related methods for performing a CPODE process without damaging source/drain epi features of active regions adjacent to an active edge. In some embodiments, a dummy GAA structure may be formed at the active edge, with source/drain epi features of adjacent active regions disposed on either side of the dummy GAA structure. Prior to the CPODE etching process, a metal gate etching process is performed to remove the metal gate layer from the dummy GAA structure. In some examples, the metal gate etching process selectively removes the metal gate layer without removing the high-K dielectric of the dummy GAA structure. The metal gate etching process may include a wet etch composed of a combination of ammonium hydroxide ($NH_4OH$), hydrogen peroxide ($H_2O_2$), and water ($H_2O$). After the metal gate etching process, regions of the dummy GAA structure between the nanowire/nanosheet channels and the inner spacers include both the unremoved high-K dielectric and the interfacial layer (chemical oxide layer) disposed next to the source/drain epi features of the adjacent active regions. The unremoved high-K dielectric thus provides another layer, in addition to the interfacial, to resist the CPODE dry etching process and effectively mitigate weak spots, present in at least some conventional processes, as described above. Thus, during the CPODE dry etching process, damage to the adjacent source/drain epi features will be effectively reduced or eliminated. By employing the disclosed CPODE process, a CPODE process window is enlarged and device performance and reliability of transistors formed in the adjacent active regions will be enhanced. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method including providing a dummy structure having a plurality of channel layers, an inner spacer disposed between adjacent channels of the plurality of channel layers and at a lateral end of the channel layers, and a gate structure including a gate dielectric layer and a metal layer interposing the plurality of channel layers. In some embodiments, the dummy structure is disposed at an active edge adjacent to an active region. In some examples, the method further includes performing a metal gate etching process to remove the metal layer from the gate structure while the gate dielectric layer remains disposed at a channel layer-inner spacer interface. In various embodiments, the method further includes after performing the metal gate etching process, performing a dry etching process to form a cut region along the active edge. In some embodiments, the gate dielectric layer disposed at the channel layer-inner spacer interface prevents the dry etching process from damaging a source/drain feature within the adjacent active region.

In another of the embodiments, discussed is a method including fabricating a device including a first transistor in a first active region, a second transistor in a second active region, and a dummy transistor at a boundary between the first and second active regions. In some embodiments, each of the first transistor, the second transistor, and the dummy transistor include a gate dielectric layer disposed on surfaces of adjacent channel layers and a metal gate layer disposed on the gate dielectric layer. In some examples, the method further includes forming a material layer over each of the first transistor, the second transistor, and the dummy transistor and etching a portion of the material layer to expose the dummy transistor. In various embodiments, the method further includes after exposing the dummy transistor, removing the metal gate layer from the dummy transistor without removing the gate dielectric layer from the dummy transistor. In some cases, the method further includes after removing the metal gate layer from the dummy transistor, forming a first trench through the dummy transistor at the boundary between the first and second active regions. In some examples, at least a portion of the gate dielectric layer from the dummy transistor, disposed along a sidewall of the first trench, prevents etching of source/drain features within each of the first and second active regions.

In yet another of the embodiments, discussed is a semiconductor device including a transistor disposed in an active region, where the transistor includes a source/drain feature. In some embodiments, the semiconductor device further includes an isolation region disposed at an active edge, the active edge defined at a boundary of the active region, where the isolation region includes a nitride-filled trench. In some examples, the semiconductor device further includes a trench sidewall region disposed between and in contact with each of the isolation region and the source/drain feature, where the trench sidewall region provides separation between the isolation region and the source/drain feature, and where the trench sidewall region includes a plurality of high-K gate dielectric layer portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    etching a metal layer from a dummy gate structure disposed at an active edge, wherein the etching the metal layer removes the metal layer from between adjacent channel layers, and wherein a gate dielectric layer of the dummy gate structure remains disposed between the adjacent channel layers after removal of the metal layer; and
    after etching the metal layer from the dummy gate structure, forming a cut region along the active edge, wherein a portion of the gate dielectric layer remains disposed at a channel layer-inner spacer interface after formation of the cut region.

2. The method of claim 1, wherein the portion of the gate dielectric layer that remains disposed at the channel layer-inner spacer interface prevents damage to a source/drain feature adjacent to the active edge during formation of the cut region.

3. The method of claim 1, wherein the gate dielectric layer includes both an interfacial layer and a high-K gate dielectric layer.

4. The method of claim 1, wherein etching the metal layer from the dummy gate structure includes performing a wet etching process.

5. The method of claim 4, wherein the wet etching process includes a combination of ammonium hydroxide (NH$_4$OH), hydrogen peroxide (H$_2$O$_2$), and water (H$_2$O).

6. The method of claim 1, further comprising:
    after forming the cut region, performing a refill process to form a nitride layer within the cut region.

7. The method of claim 1, wherein the dummy gate structure includes a spacer layer disposed on sidewalls of a top portion of the dummy gate structure, and wherein the portion of the gate dielectric layer that remains disposed at the channel layer-inner spacer interface corresponds to a thickness of the spacer layer.

8. The method of claim 1, further comprising:
    prior to etching the metal layer from the dummy gate structure, performing a dry etching process to remove a silicon layer disposed over the dummy gate structure.

9. A method, comprising:
    forming a device including a dummy transistor at a boundary between first and second active regions, wherein the dummy transistor includes a gate structure disposed between adjacent channel layers;
    removing a metal gate layer from the gate structure of the dummy transistor without removing a gate dielectric layer from the gate structure of the dummy transistor; and
    after removing the metal gate layer, forming a first trench through the dummy transistor, wherein at least a portion of the gate dielectric layer from the gate structure of the dummy transistor remains disposed along a sidewall of the first trench.

10. The method of claim 9, wherein the dummy transistor includes an inner spacer disposed between the adjacent channel layers and at a lateral end of the adjacent channel layers.

11. The method of claim 9, wherein the portion of the gate dielectric layer from the gate structure of the dummy transistor, disposed along the sidewall of the first trench, is disposed at a channel layer-inner spacer interface.

12. The method of claim 9, wherein the gate dielectric layer includes an interfacial layer and a high-K gate dielectric layer disposed over the interfacial layer.

13. The method of claim 9, wherein the removing the metal gate layer includes removing the metal gate layer using a wet etching process including a combination of ammonium hydroxide (NH$_4$OH), hydrogen peroxide (H$_2$O$_2$), and water (H$_2$O).

14. The method of claim 9, further comprising:
    prior to removing the metal gate layer from the gate structure of the dummy transistor, cutting a portion of the metal gate layer disposed between adjacent fins to form a second trench; and
    forming a first nitride layer within the second trench to electrically isolate portions of the metal gate layer disposed over each of the adjacent fins.

15. The method of claim 14, further comprising:
    after forming the first nitride layer within the second trench, etching a portion of the first nitride layer to expose the dummy transistor.

16. The method of claim 9, further comprising:
    after forming the first trench, forming a second nitride layer within the first trench.

17. The method of claim 9, wherein the portion of the gate dielectric layer from the gate structure of the dummy transistor is disposed adjacent to the first trench and beneath a gate spacer layer of the dummy transistor.

18. A semiconductor device, comprising:
    an isolation region disposed at a boundary of an active region and adjacent to a source/drain feature; and
    a trench sidewall region disposed between and in contact with each of the isolation region and the source/drain feature;
    wherein the trench sidewall region includes a plurality of high-K gate dielectric layer portions, and wherein a first thickness of each high-K gate dielectric layer portion of the plurality of high-K gate dielectric layer portions is substantially uniform.

19. The semiconductor device of claim 18, wherein the trench sidewall region further includes a spacer layer, wherein the plurality of high-K gate dielectric layer portions is disposed directly beneath the spacer layer, and wherein a second thickness of the spacer layer is substantially equal to the first thickness.

20. The semiconductor device of claim 18, wherein the trench sidewall region further includes a plurality of nanosheet channel layer portions and a plurality of inner spacer portions, and wherein each of the plurality of high-K gate dielectric layer portions is disposed at a nanosheet channel layer portion-inner spacer portion interface.

* * * * *